United States Patent [19]

Hanley et al.

[11] 4,367,411
[45] Jan. 4, 1983

[54] UNITARY ELECTROMAGNET FOR DOUBLE DEFLECTION SCANNING OF CHARGED PARTICLE BEAM

[75] Inventors: Peter R. Hanley, Rowley; Norman L. Turner, Gloucester, both of Mass.

[73] Assignee: Varian Associates, Inc., Palo Alto, Calif.

[21] Appl. No.: 164,415

[22] Filed: Jun. 30, 1980

Related U.S. Application Data

[63] Continuation of Ser. No. 45,035, Jun. 4, 1979, abandoned.

[51] Int. Cl.³ .............................................. H01J 37/00
[52] U.S. Cl. ........................... 250/492.2; 250/396 ML
[58] Field of Search ............... 250/492.2, 492.3, 396.1, 250/396 ML, 296, 398; 313/361, 433; 219/171 EB

[56] References Cited

U.S. PATENT DOCUMENTS

| | | | |
|---|---|---|---|
| 3,021,445 | 2/1962 | Widerøe | 250/396 ML |
| 3,671,895 | 6/1972 | Aucouturier et al. | 250/396 ML |
| 3,778,626 | 12/1973 | Robertson | 250/492.2 |
| 4,110,625 | 8/1978 | Cairns et al. | 250/492.2 |
| 4,117,339 | 9/1978 | Wolfe | 250/492.2 |

*Primary Examiner*—Bruce C. Anderson
*Attorney, Agent, or Firm*—Stanley Z. Cole; Norman E. Reitz

[57] ABSTRACT

A unitary electromagnet having two gaps is provided for the double deflection scanning of a charged particle beam. The unitary electromagnet is configured to permit traverse by said beam through the gaps in a plane defined by the gaps. The depth of the gaps is large as compared to the length to accommodate the scan of the beam. The mode of scanning is determined by the waveform used to energize the windings of the electromagnet and includes axial sweep scanning, off center scanning and split scanning.

9 Claims, 7 Drawing Figures

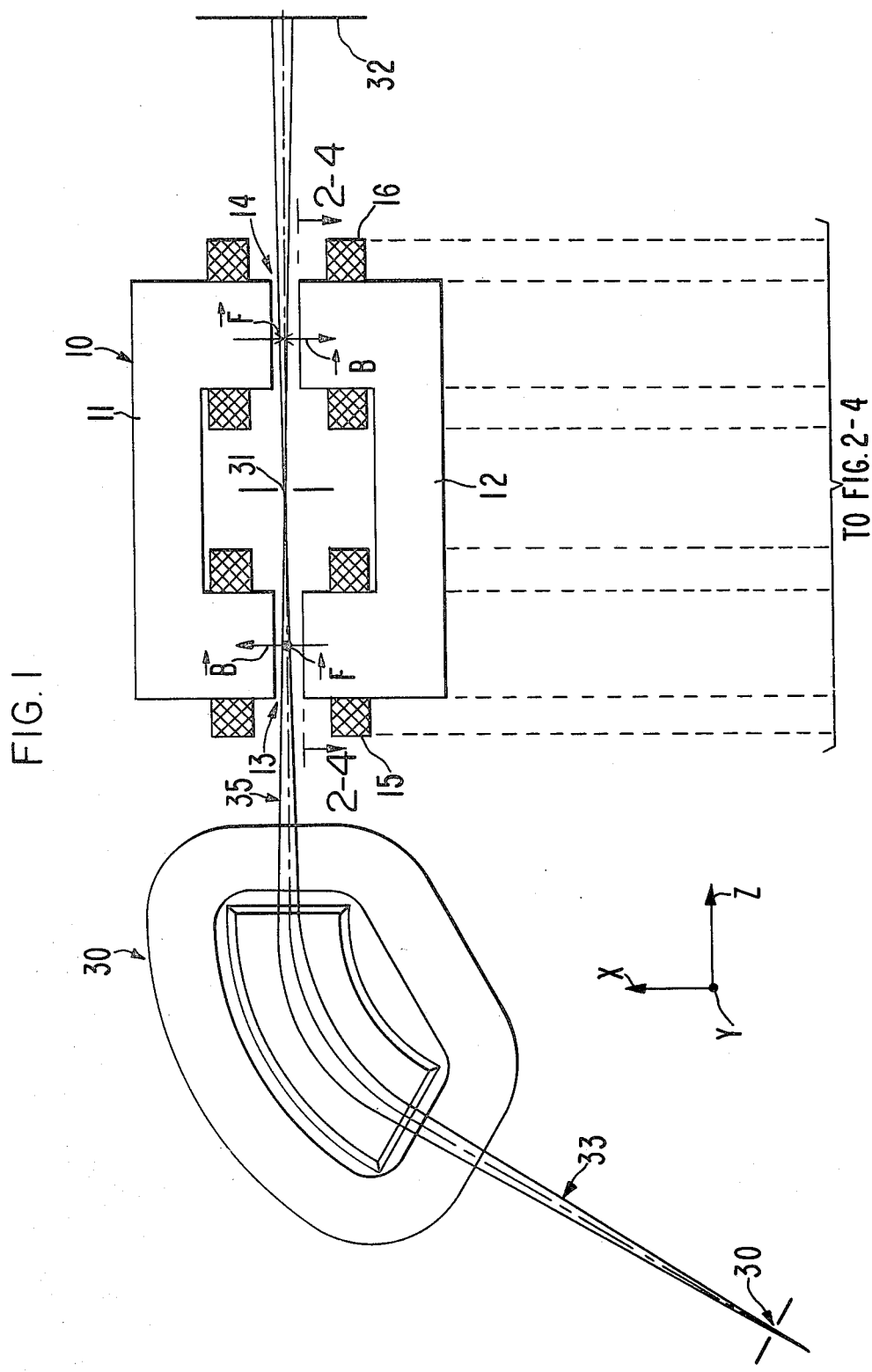

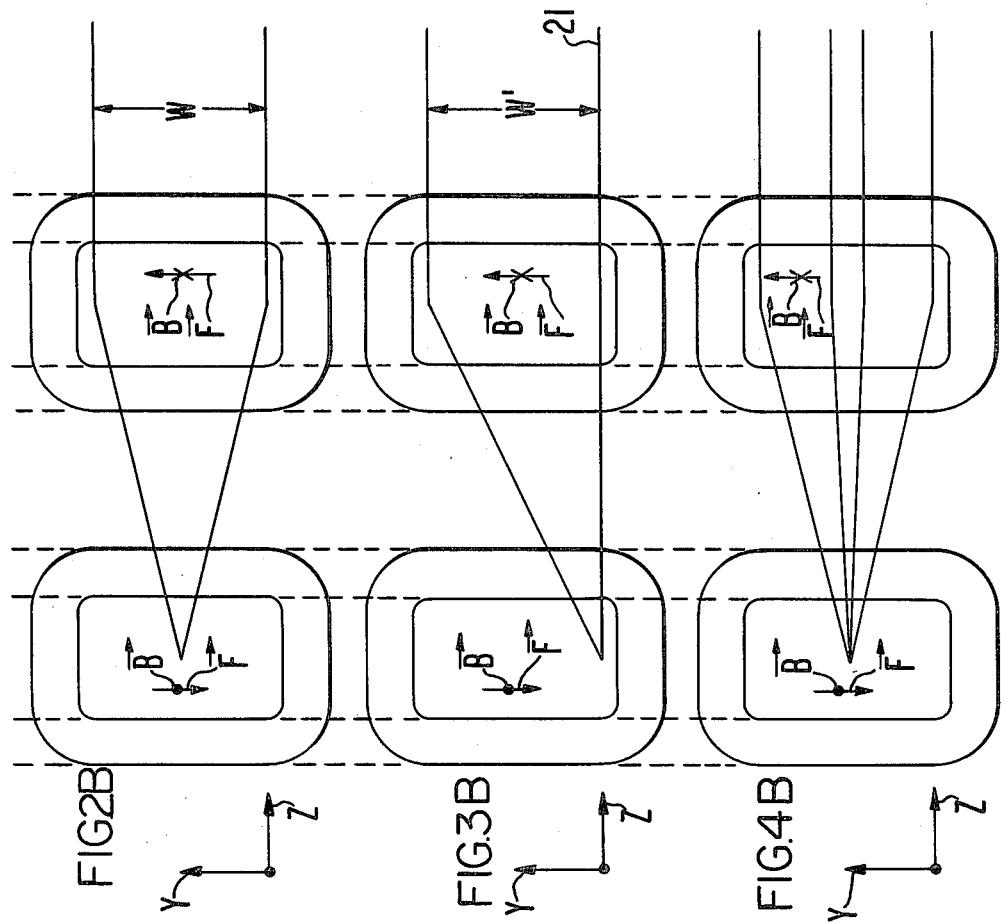

UNITARY ELECTROMAGNET FOR DOUBLE DEFLECTION SCANNING OF CHARGED PARTICLE BEAM

This is a continuation of abandoned application Ser. No. 45,035 filed June 4, 1979.

DESCRIPTION

This invention is related to an apparatus for double deflection scanning of a charged particle beam and, more particularly, relates to a single electromagnet having multiple gaps for performing double deflection scanning of a charged particle beam.

Charged particle beam systems typically incorporate a source of charged particles, an accelerator tube, separator or momentum analyzer unit and a target. To achieve uniform distribution of the charged particle beam over the target or to reduce heating, the target is sometimes moved with respect to a fixed beam as in Arndt, Jr., et al., U.S. Pat. No. 3,983,402, "Ion Implantation Apparatus" or in G. I. Robertson, U.S. Pat. No. 3,778,626, "Mechanical Scan System for Ion Implantation;" alternatively, the beam may be electromagnetically scanned with respect to the target. See P. D. Townsend, et al., *Ion Implantation, Sputtering and Their Applications*, pp. 171 et. seq., (Academic Press 1976). The latter approach inherently introduces a variable angle of incidence for the beam into the target. If the target is a semiconductor wafer being processed in an ion implantation machine, this variable angle of incidence may lead to variable depths of penetration due to the effects of channeling and may lead to other non-uniformities; this effect is enhanced as wafer diameters increase. Such variable depths of penetration are undesirable in semiconductor devices. (See G. R. Brewer, U.S. Pat. No. 3,569,757, column 1, lines 20-59).

The variable angle of incidence of an electromagnetically scanned charged particle beam has been substantially eliminated in the prior art by deflecting the beam in a direction lateral to the beam path and then counter-deflecting the beam in the opposite direction to remove the lateral velocity component. The initial velocity component (source-to-target) is not disturbed but the charged particle is laterally displaced. See G. Dearnaley, et al., *Ion Implantation*, pp. 404-406 (1973); G. R. Brewer, U.S. Pat. No. 3,569,757, "Acceleration System for Implanting Ions in Specimens;" J. E. Wolfe, U.S. Pat. No. 4,117,339, "Double Deflection Electron Beam Generator for Employment in the Fabrication of Semiconductor Devices;" and M. Thomson, "Abberations and Tolerances in a Double-Deflection Electron Beam Scanning System," J. Vacuum Science and Technology, V. 12, p. 1156 (1975). In these double deflection systems either a pair of charged plates has been employed to accomplish electrostatic deflection or an electromagnet has been employed to accomplish magnetic deflection. Thus, the accomplishment of complete double-deflection requires two pairs of plates for electrostatic deflection or requires a pair of electromagnets for magnetic deflection. If both x and y deflections are accomplished, then twice again as many plates or electromagnets are required. Also, with these double deflection systems the employment of separate means for accomplishing deflection and for accomplishing redeflection necessitates a careful matching of the configuration and placement of each deflection means and of the electrical circuitry associated with each deflection means. If close matching is not achieved, then a lateral component of velocity may remain and additional nonuniformities may be introduced by the very attempt to obtain uniform angle of incidence. In general, the use of multiple components increases initial capital costs and tends to increase energy consumption during operation.

It is accordingly an object of the present invention to accomplish double deflection scanning of a charged particle beam by a unitary electromagnetic means.

It is a further object of the present invention to accomplish double deflection scanning of a charged particle beam which is free from abberation and error.

It is another object of the present invention to provide a single electromagnet having multiple gaps for accomplishing both the deflection and the re-deflection in a double deflection scanning scheme.

It is an additional object of the present invention to avoid the hot spots associated with neutral particles in the double deflection scanning of a charged particle beam.

It is a still further object of the present invention to provide end station switching in the scanning of a charged particle beam.

BRIEF DESCRIPTION OF THE DRAWINGS

For a more complete understanding of the apparatus of the present invention, reference may be had to the accompanying drawings which are incorporated herein by reference and in which:

FIG. 1 is a side view of the electromagnetic apparatus of the present invention illustrating the receipt of a charged particle beam from a momentum analyzer unit, passage of the beam through the apparatus and delivery of the beam to a target;

FIG. 2A is an electrical waveform for energizing the coils of the electromagnet in accordance with one embodiment of the present invention;

FIG. 2B is a plan view of the elecromagnet of FIG. 1 illustrating the scanning achieved by the wave form of FIG. 2A;

FIG. 3A is an electrical waveform for energizing the electromagnet in accordance with a second embodiment of the present invention;

FIG. 3B is a plan view of the electromagnet of FIG. 1 illustrating the scan obtained by utilizing the waveform form of FIG. 3A;

FIG. 4A is another electrical waveform for energizing the electromagnet in accordance with a third embodiment of the present invention; and FIG. 4B is a plan view of the electromagnet of FIG. 1 illustrating the scan obtained by using the waveform of FIG. 4A.

SUMMARY OF THE INVENTION

A unitary electromagnet having two gaps is provided for the double deflection scanning of a charged particle beam. The gaps are placed in the magnet to permit successive line of sight passage of a charged particle beam through the gaps. In order to accommodate the linear scan of the beam the depth of the gaps are large as compared to the length. The mode of scanning includes axial sweep scanning, off center scanning and split scanning. The modes are determined by the shape of the electrical waveform used to energize the electromagnet.

DESCRIPTION OF THE PREFERRED EMBODIMENTS

As set out previously there are two approaches to the delivery of a uniform concentration of charged particles to a target. In an ion implantation system these approaches attempt to deliver a uniform dose of ions to a semiconductor wafer by either mechanically scanning the wafer across the path of a fixed ion beam or by electromagnetically scanning an ion beam across the surface of a semiconductor wafer held in a fixed position. Obtaining a reciprocating transverse scan in the first instance presents a difficult mechanical problem and introduces limitations on scanning rates due to the acceleration and deceleration required at the end of each scan. Scanning over the area of a wafer by strictly electromagnetic means is difficult because electrostatic plate displacements or magnet gap lengths need to be large to accomodate the scan. This leads to high field strengths, energy inefficiencies and fringing fields which in turn cause undesirable effects. A hybrid scanning system in which the best features of both approaches are incorporated provides advantages over the adoption of either individual approach. If such a system incorporates rotary scanning for the target, i.e., the fixture on which the semiconductor wafer is mounted, high scanning rates can be achieved in what is essentially one linear direction by the arcuate travel of the spinning target, provided the height of the transverse scan is not great. See, for example, the discussion of pattern traces in G. I. Robertson U.S. Pat. No. 3,778,626. The transverse scan is a sawtooth or oscillating function, which is subject to the modulation discussed subsequently, and can be nicely achieved by magnetic means, particularly by double deflection magnetic scanning. This is possible because the deflection forces are impressed on the moving ion in a direction orgthogonal to the direction of the magnetic field ($\vec{B}$) and orthogonal to the direction of the ion's velocity. Since the deflection (and redeflection) occurs in the plane which bisects the two gaps, the gaps may be relatively small. Electrostatic deflection, on the other hand, requires larger gaps to be used since the deflection force is impressed in the direction of the electric field ($\vec{E}$) and the scan occurs along the gap length. Alternative to the magnetic scan/rotational scan combination, a first transverse scan can be produced by magnetic means and a second scan perpendicular thereto can be obtained by electrostatic means. With either combination the target is mounted sensibly orthogonal to the impinging ion beam or is oriented at some small fixed angle with respect thereto. The unitary magnet for double deflection scanning of the present invention is thus readily adaptable for incorporation into one of these hybrid scanning systems.

Double deflection scanning, as discussed previously, is a natural technique to produce lateral displacement of a beam having a reasonable height. Large beam heights are not ideally suited for magnetic scanning because gap lengths would be too large and would require inordinately high field strengths. With such double deflection scanning careful matching of the deflection and re-deflection magnetic strengths must be obtained if dose uniformity is important. Since typically ion dose must be maintained within a uniformity of 1% matching is required if separate magnets are employed. The unitary electromagnet of the present invention has dual gaps positioned to provide line of sight passage through the two gaps for an ion beam whereby the ion beam passes through each gap in a plane which is essentially perpendicular to the $\vec{B}$ field across the length of the gap. The configuration which establishes this condition is shown in FIG. 1. Since the electromagnet describes a closed loop for the magnetic force lines the same magnetic flux results in forces which produce deflection and re-deflection. The matching is inherent so long as the pole faces and gap lengths are either equal or are appropriately balanced. The waveform for energizing the electromagnet need not be matched to any standard since the same magnetic flux produces the $\vec{B}$ field across each gap of the magnet. The waveform simply determines the position of the ion beam on the wafer and not the angle of incidence. This unitary magnet for double deflection avoids the need for separate magnets, and precision electrical circuitry and can be simply and compactly constructed.

Structure

By reference to FIG. 1, the structure of the unitary magnet of the present invention may be seen. A closed loop electromagnet 10 is made up of two u-shaped cores 11 and 12. The size and shape of cores 11 and 12 are matched so that end-to-end they form gaps 13 and 14. Preferably, the gap lengths (distance from pole to pole) are equal. In this event, windings 15 will be symmetrically positioned and will carry the same current. Gap lengths will typically be on the order of 4 cm. The depth of the pole faces (direction into the plane of the drawing) will be on the order of 30 cm and the width of the pole faces (direction in the plane of the drawing) will be on the order of 30 cm. The overall width of the u-shaped cores, i.e,. the distance between the outsides of the two pole faces, will be on the order of 100 cm.

In FIGS. 1-4 the direction of the magnetic fields and the force fields for a positively charged ion can be seen; the force field for a negatively charged ion would be reversed. In FIG. 1, in gap 13 the magnetic field $\vec{B}$ is from the bottom pole to the upper pole. Since the ion beam moves from left to right, the force field $\vec{F}$ is out of the drawing (shown by the tip of the arrow). Conversely in gap 14 the magnetic field $\vec{B}$ is from the upper pole to the bottom pole and the force field $\vec{F}$ is into the drawing (shown by the feathers of the arrow). The comparable magnetic and force field directions can also be seen in FIGS. 2-4, for the arbitrary time t, designated in FIGS. 2A, 2B and 2C.

Operation

By reference to the side view of FIG. 1 the operating environment of the unitary magnet of the present invention can be seen. An ion source 30, which may be a point source as shown or a parallel source, produces a diverging ion beam 33 which is introduced into momentum analyzing magnet 30. The appropriate ionic species such as As+ with an energy of 80 kev is selectively deflected on the basis of charge, energy and mass so that it exits from momentum analyzing magnet 30 as a converging beam 35; species of different mass, energy and charge are not deflected in this converging beam. The unitary magnet 10 is positioned to accept the converging beam 35 through one of its gaps. Optimally, the relative distances will be selected so that the beam converges in the center of unitary magnet 10; this tends to neutralize any possible optical effects of the unitary magnet in the plane in which the beam is deflected and re-deflected, the X-Z plane in the drawing of FIG. 1. Such point to point (source to center of unitary magnet) focusing permits the most compact magnet to be used.

Parallel to point focusing would accomplish the same result, providing the focal point was in the center of the unitary magnet.

The minimum height of the beam, i.e., the deviation above and below the plane of deflection and re-deflection, will depend largely upon the optical properties of the incident beam. The unitary magnet 10 is preferably optically neutral with respect to the beam so that it only imparts forces in the Y-Z plane as it deflects and re-deflects the ion beam. Optical properties may be introduced if, for example, it is desired to deliberately produce channeling in semiconductor wafers. This can be done by varying the gap areas or by shaping the pole faces. In FIGS. 2-4 what is obtained is Y-direction scanning with an afocal unitary magnet. If a specific beam height is to be obtained then the relative positions of the unitary magnet and momentum analyzer can be altered to defocus the beam and increase the height. If a rotating disc is used for mounting semiconductor wafers then the interaction of the rotational scan of a semiconductor wafer mounted on rotating disc 32 and the transverse scan is comparable to the pattern trace discussed in Robertson, U.S. Pat. No. 3,778,626.

A series of embodiments of the unitary magnet of the present invention are illustrated in FIGS. 2-4. These figures are taken through the gaps as shown by the dotted line in FIG. 1. The variables are the point of entry for the ion beam and the waveform used to energize the windings of the electromagnet. By specifying these variables, a large variety of useful embodiments can be obtained.

In the first embodiment of FIGS. 2A-2B, the ion beam is introduced along a line in the Y-Z plane which bisects gap 13. A triangular wave form, shown in FIG. 2A, is used to energize the electromagnet. Each half cycle of the triangular wave form produces a scan from one side of the second pole face to the other side. The amplitude of the waveform is such that the beam is directed to move from one edge of the second pole face to the other edge. The effective depth of the scan will be less than the geometric depth of the pole faces; it will typically be on the order of ⅔ of the geometric depth. Since the B field is reversed in the second gap and is of the same intensity, the lateral velocity in the X-Z plane introduced by the first magnetic field will be removed by the second magnetic field. Thus, a scanning width W is obtained.

In a second embodiment shown in FIGS. 3A-3B the ion beam is introduced in the Y-Z plane along one edge of the pole face of the first gap. Here again a complete cycle of the electrical waveform will result in a scan of the beam from one edge of the pole face in the second gap to the other and back again. An advantage of this method is that neutral particles created along the orginal beam axis will bombard one spot on the target along the line of entry of the beam which can be chosen so that it does not coincide with a semiconductor wafer area.

In a third embodiment shown in FIGS. 4A-4B the waveform is chosen to have a built-in bias. Basically, sawtooth functions are superimposed in alternation upon a positive bias and a negative bias. This permits two separate areas to be scanned, i.e., produces a split scan, thereby permitting separate end stations to be used. Magnetic switching is essentially instantaneous and can allow deflection from one end station to another.

With all of the above embodiments for magnetically producing a transverse scan the rate of scan has been shown to be constant so that the waveform has been a sawtooth function with perfectly linear segments. If the velocity of the scan in the direction which is perpendicular to the transverse scan is not of constant rate, as is the case with a rotating target where the orthogonal scan rate varies as the radius of the point of beam impact, then the rate may be varied. The transverse scan rate would be maintained inversely proportional to this radius in order to obtain a uniform distribution of ions. This is accomplished by modulating the basic sawtooth waveforms used to energize the electromagnets. Either a memory means such as a programmable read only memory or a real time feedback means may be used to determine the location of the beam at any point in time to allow appropriate modulation of the basic sawtooth function by the waveform generating means. Alternatively, the beam intensity may be varied by the source of the charged particle beam in accordance with input from the memory means or feedback means to compensate for variations in scan velocity so that a uniform dose of ions will be delivered per unit area. See discussion in G. I. Robertson, "Mechanical Scan System for Ion Implantation," U.S. Pat. No. 3,778,626.

We claim:

1. A unitary apparatus for double deflection scanning of a charged particle beam, comprising:
    an electromagnet containing a pair of gaps, wherein said gaps are configured in said electromagnet so as to define a common plane to thereby permit an in-the-plane traverse by said charged particle beam through said gaps, the windings associated with the poles of each of said gaps being driven by an energizing waveform so that the magnetic field through said plane in one gap is of opposite polarity to the magnetic field through said plane in the other gap;
    a source of a charged particle beam positioned adjacent said one gap so as to introduce said beam in said plane in said one gap; and
    a waveform generating means for energizing said windings of said electromagnet to produce a scan of said beam in said plane which ranges between the edges of the pole faces associated with said other gap.

2. A unitary apparatus for double deflecton scanning of a charged particle beam in accordance with claim 1 wherein said electromagnet provides only lateral displacement to said charged particle beam which traverses said gaps in said plane.

3. A unitary apparatus in accordance with claim 1 wherein said
    source of a charged particle beam is positioned adjacent said one gap so as to introduce said beam in said plane along an edge of the pole faces associated with said one gap.

4. A unitary apparatus in accordance with claim 1 wherein said
    source of a charged particle beam is positioned adjacent said one gap so as to introduce said beam in said plane centrally of said gap and wherein said waveform generating means for energizing the windings of said electromagnet produces a split scan of said beam inbetween the extremes of the pole faces associated with said other gap.

5. A unitary apparatus in accordance with claim 1 in combination with rotational target means positioned adjacent said other gap.

6. A unitary apparatus in accordance with claim 5 wherein said rotational target means is oriented sensibly orthogonal to said plane.

7. A unitary apparatus in accordance with claim 6 wherein said
   source of a changed particle beam positioned adjacent said one gap introduces said beam along a particular trajectory in said plane; and wherein said
   waveform generating means for energizing the windings of said electromagnet produces a scan of said beam in said plane inbetween the extremes of the pole faces associated with said other gap, said beam impinging on said target with a transverse speed varying inversely with the distance of said beam from the center of rotation of said rotational target to thereby deliver a uniform dosage of ions to wafers mounted on said target.

8. A unitary apparatus in accordance with claim 6 wherein said
   source of a charged particle beam positioned adjacent said one gap introduces said beam along a particular trajectory in said plane, said source having a variable intensity; and said
   waveform generating means for energizing the windings of said electromagnet produces a scan of said beam in said plane; and the foregoing being combined with
   beam position means for determining the position of said beam with respect to the center of rotation of said rotating target and for providing this positional information to said source so that the intensity of said source is varied proportionally to the distance of said beam from said center of rotation to deliver a uniform dosage of ions to a wafer mounted on said target.

9. A unitary apparatus in accordance with claim 1 in combination with two pairs of electrostatic deflection plates positioned adjacent said other gap, each of said pairs being positioned parallel to and straddling said plane, the first of said pairs having an electrostatic field in one direction to introduce a deflection velocity component perpendicular to said plane and the second of said pairs having an electrostatic field in the opposite direction to remove said deflection velocity component.

* * * * *